United States Patent [19]

Dudderar et al.

[11] Patent Number: 5,767,447

[45] Date of Patent: Jun. 16, 1998

[54] ELECTRONIC DEVICE PACKAGE ENCLOSED BY PLIANT MEDIUM LATERALLY CONFINED BY A PLASTIC RIM MEMBER

[75] Inventors: Thomas Dixon Dudderar, Chatham, N.J.; Byung Joon Han, Seoul, Rep. of Korea; Venkataram Reddy Raju, New Providence; George John Shevchuk, Old Bridge, both of N.J.

[73] Assignee: Lucent Technologies Inc., Murray Hill

[21] Appl. No.: 567,659

[22] Filed: Dec. 5, 1995

[51] Int. Cl.[6] .................................................. H01L 23/02
[52] U.S. Cl. ........................................ 174/52.4; 361/760
[58] Field of Search ............................ 174/52.2, 52.4, 174/52.3, 52.1; 361/760, 761; 257/787, 788, 687, 688

[56] References Cited

U.S. PATENT DOCUMENTS

| | | | |
|---|---|---|---|
| 4,546,412 | 10/1985 | Nakazawa et al. | 361/395 |
| 5,423,119 | 6/1995 | Yang | 29/841 |
| 5,455,386 | 10/1995 | Brathwaite et al. | 174/52.4 |
| 5,473,512 | 12/1995 | Degani et al. | 361/760 |

*Primary Examiner*—Kristine L. Kincaid
*Assistant Examiner*—Kristina Soderquist
*Attorney, Agent, or Firm*—Mathews, Collins, Shepherd & Gould, P.A.

[57] ABSTRACT

The bottom and side surfaces of an electronic device, such as an integrated circuit chip or a multichip assembly, are surrounded by a soft gel medium. The gel medium is laterally confined by a rigid plastic rim that is epoxy-bonded in place along its perimeter. A plate, made of plastic or metal, can be attached to the top surface of the rim, in order to provide a cover for the package.

6 Claims, 2 Drawing Sheets

ELECTRONIC DEVICE PACKAGE ENCLOSED BY PLIANT MEDIUM LATERALLY CONFINED BY A PLASTIC RIM MEMBER

TECHNICAL FIELD OF INVENTION

This invention relates to electronic devices and more particularly to packages for semiconductor electronic devices (such as silicon integrated circuit chips and assemblies of such silicon chips).

BACKGROUND OF THE INVENTION

A semiconductor electronic device—such as a silicon semiconductor integrated circuit chip, or a multichip assembly composed of two or more interconnected silicon semiconductor integrated circuit chips mounted on a common interconnection substrate, or at least one such chip mounted on another such chip—requires electrical access to external circuitry via a multiplicity of input-output ("I/O") terminals or metallic pads of the electronic device. Typically this access is supplied, among other things, by means of a circuit board upon which the electronic device is mounted, whereby an assembly is formed. The circuit board can take such forms as a printed circuit board or a laminated multilayer (multi-metallization-level) circuit board, the latter also being known as a "lead-frame" board. In addition, if desired, the lead-frame-board is mechanically supported by and electrically connected to, such as by means of a solder bump (globule) array or by a plug-in pin grid array, a so-called "mother board"=0 typically having a much larger area than that of the lead-frame board; and there can be located upon this mother board a number of other electrically interconnected chips or assemblies as well as a number of interconnected lumped electrical elements such as capacitors, transformers, and resistors that cannot be conveniently (if at all) integrated into the chips or multipchip assemblies, as well as plugs and connectors.

U.S. Pat. No. 5,241,133, issued to William B. Mullen, III, et al. on Aug. 31, 1993, discloses an electronic device assembly in which a silicon integrated circuit chip is electrically connected to metallization located on an underlying printed circuit board by means of gold wire bonds. At the same time, to provide mechanical support of the silicon chip, a chip-bonding-metallization pad is located on the circuit board at a location underlying the chip, and the chip is attached to this metallization pad by means of a conductive adhesive. The lateral extent of this chip-bonding-metallization pad is almost as large as that of the chip. A problem that arises in the resulting assembly of the circuit board and the chip stems from a mismatch in thermal expansion coefficients between the board and the chip, whereby the board is undesirably stressed by the chip. The larger the lateral dimensions of the chip, the more severe the problem becomes: thermal expansion is proportional to length.

The aforementioned patent further teaches that a metallic stiffener, in the form of a plate, having a relatively high flexural modulus (a modulus in excess of approximately 2,000,000 psi=14,000,000,000 Pa) and coated on both sides with the adhesive, can be inserted between the metallization pad and the semiconductor chip in order to reduce the mechanical stress in the circuit board caused by the mismatch between the aforementioned thermal expansion coefficients. However, because of the inflexibility of the stiffener itself, to the extent that stress is thereby reduced in the silicon chip, undesirable strain will still be produced in the underlying circuit board. This strain is further undesirable when the circuit board is supported on a mother board by means of a solder bump array: thermal cycling during electrical operations of the chip will produce expansion-contraction cycling of the circuit board, whereby the solder bumps tend to suffer from metal fatigue and ultimate failure.

The aforementioned patent also teaches that the foregoing assembly (of silicon chip electrically connected to, and physically mounted on, the printed circuit board) is encapsulated on its top surface with a non-pliant-when-cool molding compound by means of a molding machine, in order to seal (encapsulate) the assembly and to seal the silicon chip against the ambient atmosphere as known in the art. However, the thermal expansion coefficient of the molding component cannot be equal to both that of the silicon chip and that of the (thermally mismatched) printed circuit board. Thermal cycling during electrical operations of the chip therefore will tend to cause undesirable stresses or strains either in the chip, or in the circuit board, or in both. More specifically, the thermal cycling of the molding compound will tend to cause it, after having been cured, to break away either from the chip, or from the circuit board, or from both, whereby the wire bond located in the neighborhood of such breaking tends to break. Also, the high pressure and temperature of the molding compound during molding tends to sweep away the wire bonds or to deform them such that they form a short circuit.

U.S. Pat. No. 5,473,512 (Degani 20-11-3-3) teaches an electronic device package that alleviates the problems stemming from the mismatch of the thermal expansion coefficients and that is relevant to this patent.

SUMMARY OF THE INVENTION

In a specific embodiment, this invention involves an electronic device package comprising:

(a) an electronic device having a bottom surface and at least a portion of a side surface coated with a pliant medium such as a soft gel medium, the medium having a top surface and a side surface (b) a rim member, comprising premolded plastic material, surrounding the electronic device and having an internal side surface, the side surface of the medium being bounded by the internal side surface of the rim member.

In this way, the electronic device is protected by the pliant medium, which also mitigates thermal mismatch otherwise caused by a non-pliant medium. Moreover, the rim facilitates encapsulating the electronic device with the pliant medium.

As used herein, the term "electronic device"includes, but is not limited to, a single semiconductor integrated circuit chip, a multichip assembly comprising two or more such chips located on and connected to an interconnection silicon substrate, or a composite of one such chip or multichip assembly that is flip-chip bonded or otherwise bonded to either another such chip or another such multichip assembly.

Advantageously, a rigid member mechanically supports the electronic device. The rigid member can be a circuit board or a combination of a circuit board supported by a mother board such as by means of an array of solder globs.

Advantageously, a cover member having a flat external major surface is located overlying the rim member. This cover member can comprise a premolded plastic plate; or it can comprise a thermally conducting plate, typically made of aluminum or copper, that can conduct away the heat generated by the electronic device during electrical operations. The flat external major surface of the cover member supplies a surface that enables vacuum-adhesion of a standard pick-and-place tool. The cover member itself mechanically protects the electronic device from outside mechanical forces. In addition, advantageously the cover member comprises electrically conducting material, which can be the same plate as the thermally conducting plate mentioned above, whereby the cover member provides electrical shielding of the electronic device from electromagnetic interference and electrostatic discharge.

Advantageously also, the bottom surface of the cover member has protruding ridge segments, and these protruding ridge segments have outside surfaces that fit slightly spaced apart from the internal side surface of the rim member. In this way, undesired mechanical stress due to thermal expansion mismatch between the cover member and the underlying structure—such as a structure comprising a circuit board, a mother board, or metallic wiring—is alleviated.

BRIEF DESCRIPTION OF THE DRAWING

Only for the sake of clarity, only FIG. 1 is not to any scale.

DETAILED DESCRIPTION

Figure 1:
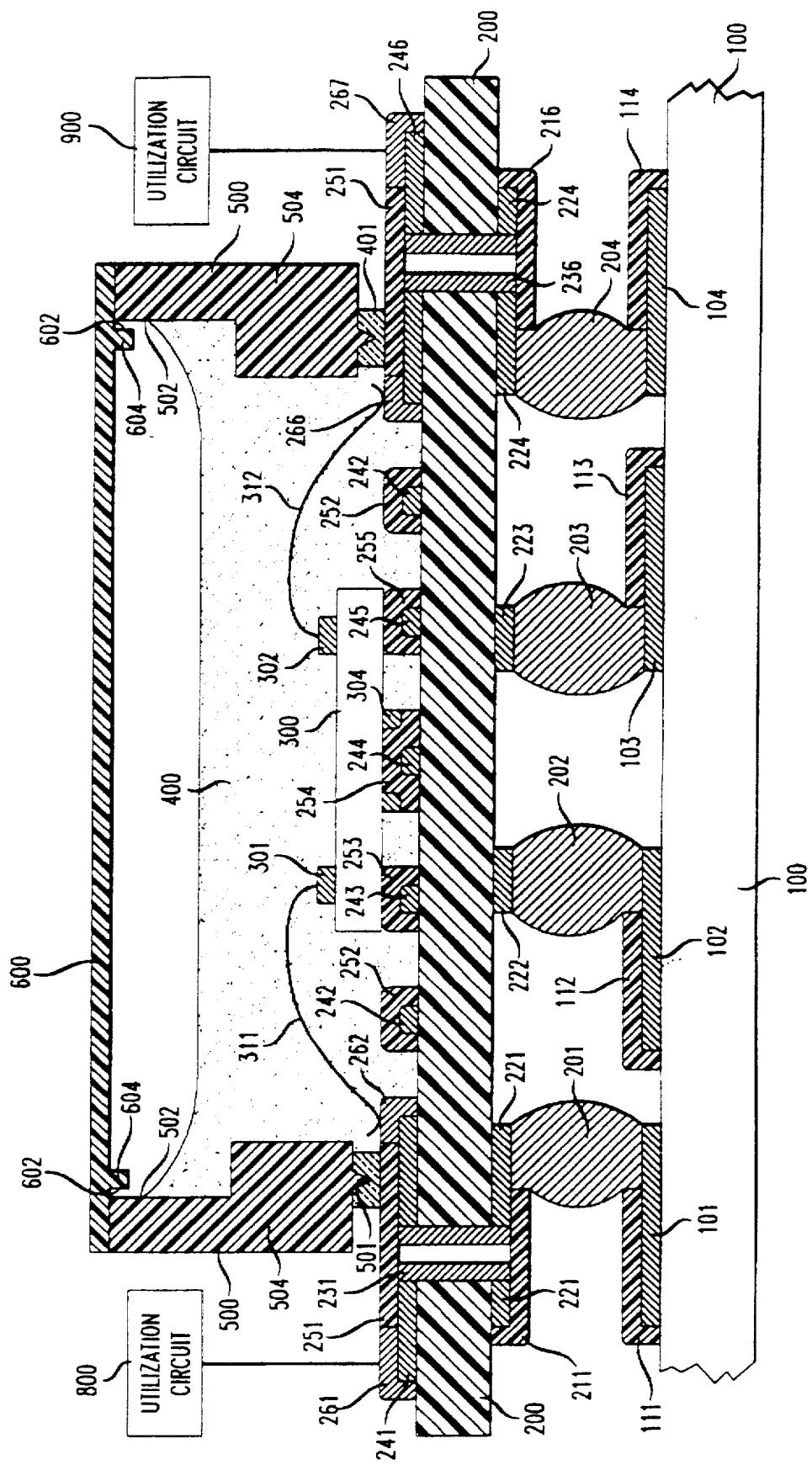
FIG. 1 is a cross-sectional elevational diagram of an electronic device package in accordance with a specific embodiment of the invention.

An electronic device package (FIG. 1) includes a circuit board 200, typically a lead-frame board, upon which is mounted an electronic device in the form of a silicon semiconductor integrated circuit chip 300 by means of exemplary (illustrative) localized metallic island layers 243, 244, and 245. The top surfaces of these metallic island layers 243, 244, and 245 are coated with exemplary localized (island) support layers 253, 254, and 255, respectively. A localized adhesive layer 304 is present advantageously on a portion of one and only one of the localized support island layers, namely, on most centrally located support layer 254, in order to inhibit lateral motion of the electronic device 300 (especially during assembly). This adhesive layer 304 is typically an epoxy that has been cured by heating it after the electronic device 300 has been placed in its proper position on all the island support layers 253, 254, and 255.

As viewed from above, the chip 300 typically has a square or rectangular shape. It should be understood that there are many more (typically for a total of six) than just the two island layers 243 and 245 shown in FIG. 1 that are distributed—together with their respective localized support layers, but advantageously not with any adhesive layers—on the bottom surface of the chip 300. These localized support layers 253, 254, and 255, together with their respective underlying metallic island layers 243, 244, and 245, respectively, serve to maintain the position of the chip 300 at a desired vertical stand-off distance from the circuit board 200.

The chip 300 is encapsulated by virtue of being contacted at all exposed portions of its top and bottom surfaces by means of a soft gel medium 400 such as a silicone gel. As used herein, the term "soft" refers to the Young's modulus of the gel medium that is sufficiently low (typically less than approximately 100 psi=700,000 Pa) as to yield a gel medium 400 which is sufficiently pliant to enable sliding of the bottom surface of the chip 300 along the top surfaces of the localized protective layers 253 and 255 during thermal cycling of the chip 300 attendant its electrical operations.

Figure 2:
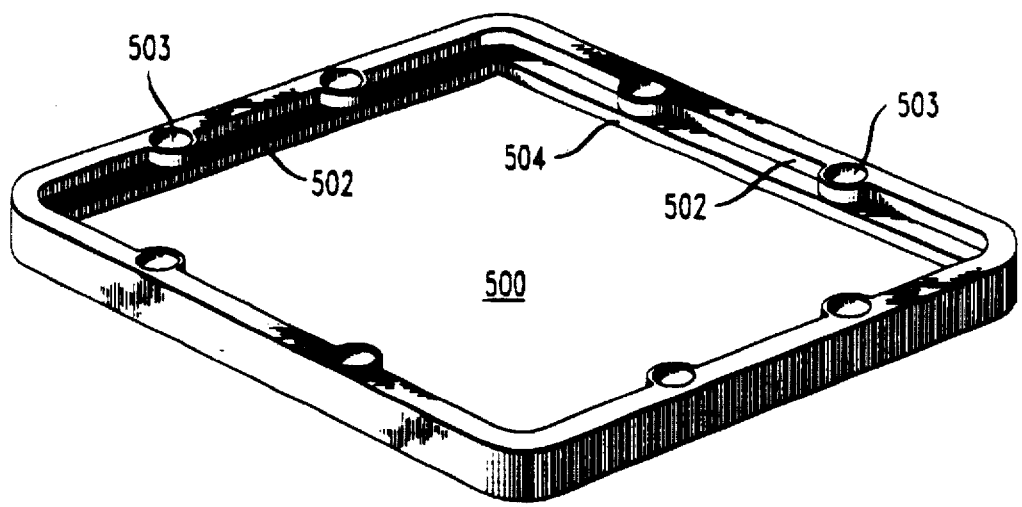
FIG. 2 is a perspective of a rim member, useful in the practice of a specific embodiment of the invention.
Figure 3:
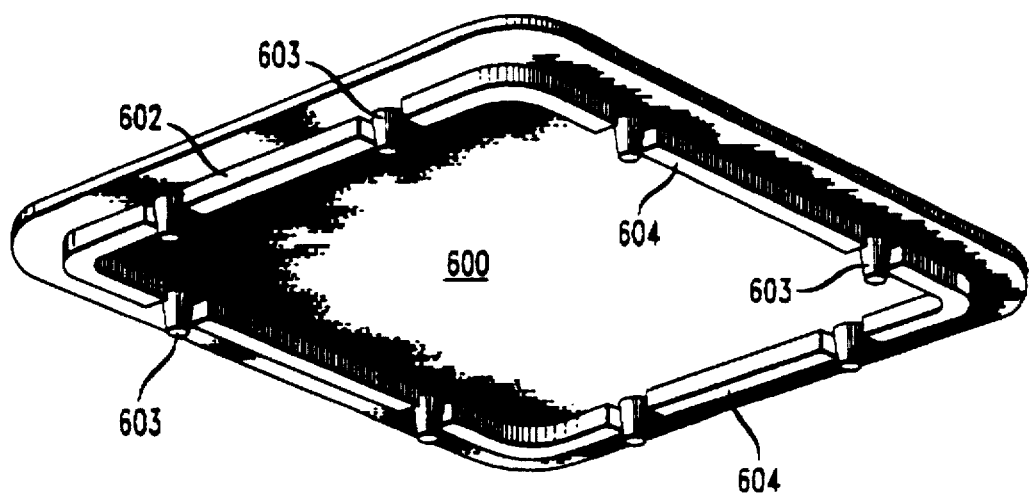
FIG. 3 is a perspective view of a cover member, useful in the practice of a specific embodiment of the invention.

The sides of the gel medium 400 are confined by the inside surfaces of a hard, premolded rim member ("rim") 500, typically made of a plastic, and advantageously having a somewhat thicker bottom portion 504. The bottom portion 504 has a bottom surface that is flat except for a projecting ridge 501 which can (but need not) run all the way around this bottom surface. A cover member ("cover") 600, typically made of pre-molded plastic or of metal, has protruding ridge segments 604 (FIGS. 1 and 3) that have outside surfaces 602. These outside surfaces 602 fit loosely against inside wall 502 of the (FIGS. 1 and 2) of the rim 500. This looseness of fit allows for thermal expansion mismatch between the material of the cover 600 and that of the circuit board 200. In addition, the cover 600 has slightly tapered, truncated solid pyramidal projections 603. Typically these projections 603 have the shape of truncated solid circular cones. The perimeters of the bottom (end) surfaces of these projection 603 thus fit snugly into slightly tapered, truncated hollow, typically circular, pyramidal indentations 503 located in the rim 500 in registration with respect to the projections 603.

Advantageously, the angle of taper of the projections 603 with respect to the vertical is less than that of the indentations 503, typically by approximately 0.02 radian (1° of arc), in order to ensure a tight fit of the perimeters of the bottom surfaces of these projections 603 into these indentations 503. Instead of these projections 603 and indentations 503, other mechanical or adhesive means can be used to ensure that the cover 600 is firmly attached to the rim 500, such as mechanical clamps or epoxy cement. Advantageously further, the indentations 503 have heights that are greater than the heights of the projections 603, in order to provide loose lateral fits between the top surfaces of the indentations 503 and the projections 603.

The protruding ridge segments 604 of the cover 600 can be omitted, although they aid in aligning the cover 600 with respect to the rim 500, and this alignment of the cover 600 can be achieved by reliance solely on the slightly tapered projections 603 of the cover 600 located in registration with respect to the indentations 503 of the rim 500.

The bottom portion 504 of the rim 500 is bonded, by means of a pliant adhesive epoxy layer 401, onto a continuous peripheral protective, typically electrically insulating, plating-mask layer 251. Exemplary wiring layers 241 and 246 are located on a top surface of the circuit board 200. It should be understood that these wiring layers 241, 246 can represent hundreds of individual printed circuit wires distributed along, beneath, and beyond the perimeter portion of the rim 500. The wiring layers 241, 246 typically are made of copper and are coated by a respective portion of the protective plating-mask layer 251. The thickness of this plating-mask layer 251 is typically in the approximate range of 10-to-50 μm, and typically it is made of a photo-definable polymer or otherwise patterned polymer.

The thickness of the adhesive epoxy layer 401 is relatively quite large: typically in the approximate range of 450-to-500 μm. Thus the bonding supplied by the epoxy layer 401 is quite pliant (in the horizontal direction).

A pair of spaced-apart exposed portions of the wiring layer 241 is coated with a suitable contact metallization, such as a layer gold on a layer nickel, whereby a pair of spaced-apart external and internal contact pads 261 and 262, respectively, are defined. Similarly, a pair of spaced-apart internal and external contact pads 266 and 267, respectively, are defined on the wiring layer 246. Typically, all these contact pads are plated on the wiring layer 241 by electroless or electroplating of nickel, followed by electroplating of gold. Advantageously all of these contact pads are plated immediately after completion of the protective layer 251.

The top surface of the chip 300 has exemplary I/O pads 301 and 302. Exemplary wire bonds 311 and 312 electrically connect these I/O pads 301 and 302 to the internal contact pads 262 and 266, respectively, as known in the art.

The external and internal contact pads 261 and 262, respectively, are electrically interconnected by the wiring layer 241, whereby the I/O pad 301 is electrically connected to the external contact pad 261 via the wire bond 311, the internal contact pad 262, and the wiring layer 241. Thus, the exemplary external contact pad 261 (or 267, or both) can serve as an electrical access point for the chip 300, either for testing the chip 300 or for electrically connecting utilization circuitry 800 (or 900, or both) to the chip 300.

On the top surface of the circuit board 200 is located an epoxy dam (epoxy flow stopping layer) composed of a metal layer 242 coated by a protective dam layer 252. This metal layer 242 is typically made of the same material as, and is typically formed at the same time as, the metallization wiring 241, 246. The protective dam layer 252 is typically made of the same materials, and is typically formed at the same time as the localized support layers 243, 244, 245 and the protective plating-mask layer 251, respectively. This epoxy dam takes the shape (as viewed from above) of a ring around the chip 300, and it serves the purpose of protecting the chip from epoxy contamination stemming from potential flow of the epoxy in the adhesive layer 401 especially when the epoxy is hot during the bonding of the rim 500. This epoxy advantageously has a relatively low glass transition temperature, typically approximately 45° C., but this bonding is advantageously performed when the epoxy is cured by heating it at a temperature which is above its glass transition temperature.

More specifically, bonding of the rim 500 advantageously is performed by first dipping the rim 500 into a reservoir of the uncured epoxy, whereby the entire bottom surface of the rim 500, including the ridge 501, becomes wet with the epoxy, and then (with the aid of a small downward force) placing the rim 500 into place on the protective plating-mask layer 251. The ridge 501, thus serves automatically to define the desired lateral position of the rim 500 and the vertical stand-off distance of the flat bottom surface of the rim 500 with respect to the top surface of the protection mask layer 251.

As an alternative, the ridge 501 can be omitted (i.e., the entire bottom surface of the rim 500 can be flat) when using a mechanical vertical alignment tool that can place the rim 500 into a position in which the desired vertical stand-off distance between the flange 504 and protective mask layer 251 is definable by the tool. Moreover, in such a case an uncured epoxy ring can first be placed onto the top surface of the protective mask 251 prior to the tool's placing the cover 500 into its final position (i.e., with the desired stand-off distance being typically in the aforementioned range of the thickness of the epoxy adhesive layer 401). At any rate, after placing the rim into the epoxy, the epoxy is then cured by heating so as to form a permanent pliant bond between the rim 500 and the protective layer 251, regardless of the presence or absence of the ridge 501.

In order to introduce the gel medium 400, after the rim 500 has been bonded to the wiring board 200 by means of the adhesive layer 401, a specified quantity of sol medium (uncured gel medium) is introduced within the confines of the rim 500 and hence to a specified level therein. The uncured gel medium advantageously has extremely low viscosity and high surface wetting properties, and hence it rapidly flows into place. The low viscosity of the uncured gel prevents any wire-bond sweep during this introduction of the uncured gel medium. The uncured gel is then cured by heating.

Then the cover 600 is snapped into place by means of compressive vertical forces that force the projections 603 into the indentations 503. In this procedure, the bottom surface of the cover 600 advantageously comes into physical contact with the top surface of the rim 500.

Because of the aforementioned pliant properties both of the soft gel medium 400 and of the bonding between the rim 500 and the protective layer 251, the thermal expansion mismatch between the circuit board 200 and the rim 500 does not harm the integrity of the wire bonds 311 and 312 during the thermal cycling; while the circuit board 200 is free to expand or contract essentially independently of the rim 500.

The uncured gel's low viscosity and high wetting properties also assure complete underfilling of the electronic device 300 with gel, including the case in which the electronic device 300 is a multichip assembly consisting of two or more integrated-circuit chips that are flip-chip bonded to substrate such as a silicon or a ceramic substrate, or the case in which the electronic device 300 is a composite of one such chip or multichip assembly that is flip-chip or otherwise bonded to a second such chip or multichip assembly.

To summarize: during the thermal cycling produced by subsequent electrical operations of the electronic device 300, the bottom surface of the chip 300 is free to slide along the top surfaces of the localized support layers 253 and 255, and the chip itself can laterally move in the gel medium 400, whereby the thermal cycling of the gel medium attendant electrical operations of the chip 300 does not tend to produce undesirable strain or stress either in the chip 300 or in the circuit board 200, or to harm the electrical integrity of the exemplary wire bonds 311, 312.

The circuit board 200 has a separate localized via hole (aperture) extending from its bottom surface to its top surface at respective positions that are located within the lateral extent of each of the exemplary wiring layers 241, 246, as known in the art. Each of exemplary circuit-board solder pads 221 and 224, each typically copper, is located on the bottom surface of the circuit board 200 at the location of each of these apertures, as known in the art. The sidewall of each of these apertures is coated with sidewall metallization 231 and 236, typically copper. The bottom of each of these sidewall metallizations 231 and 236 electrically contacts, through solder bumps (globules) 201 and 204, respectively, electrically conductive mother-board wiring layers 101 and 104, respectively, that are located on a top surface of a mother board 100, as known in the art. A two-dimensional array of exemplary solder bumps 202, 203, typically of the order of one hundred (or more, or less) in total number, electrically connect exemplary circuitboard wiring layers 222, 223 with exemplary mother-board wiring layers 102 and 103, respectively, as known in the art. The exposed surface of each of the circuit-board solder pads 221 and 224 is coated with solder masking layer 211 and 216, respectively, as known in the art. The exposed surface of each of the mother-board wiring layers 101, 102, 103, 104 is coated with a separate solder-stop layer 111, 112, 113, 114, respectively, as known in the art.

The mother board 100 can be made of, for example, aramid, epoxy-glass, or glassfiber-reinforced epoxy. The circuit board 200 can be epoxy, glass-fiber-reinforced epoxy, polyimide, or ceramic. This circuit board 200 advantageously can be soldered to the mother board 100 by means of the solder globules 201, 202, 203, and 204 either before or after the rim 500 has been bonded to the adhesive layer 401 (or directly to the protective layer 251), depending upon when the gel medium 400 is cured: the soldering of the circuit board 200 to the mother board 100 advantageously is performed either before the introduction of the gel medium 400 or after its having been cured, but at any rate it is advisable that the time interval between introduction and curing of the gel be minimized.

Although the invention has been described in detail with respect to a specific embodiment, various modifications can be made without departing from the scope of the invention. For example, the solder bumps 201, 202, 203, 204 can be made as described in U.S Pat. No. 5,346,118, or can be a plug-in pin array as known in the art. Alternatively, the mother board 100 can be omitted and all access circuitry can then be located on or in the circuit board 200, especially in cases where the latter is a laminated multilayer-metallization board.

Also, instead of the supports elements being supplied by the metallic islands 243, 244 and 245 coated by the localized support layers 253, 254 and 255, respectively, these support elements can be supplied, for example, by localized polymer layer alone or by indentation regions ( and, hence complementary raised regions) that have been fabricated (as by means of embossing) in the top surface of the circuit board 200. Moreover, the (centralized) support element formed by the localized support layer 254 and its underlying metallic island layer 244 can be consolidated with one or more of the other support elements such as the support elements formed by the localized support layers 253 and 255 together with their respective underlying metallic island layers 243 and 245, whereby only a single support element is formed, with the adhesive medium 300 being advantageously located only on a central region of this single support element so that the chip 200 is free to slide laterally at the peripheral regions of this support element. Also, the localized adhesive medium 304 can be distributed on one or more of the other support elements, especially if the totality of all areas of contact of the adhesive medium to support elements is confined to a central region of the chip 300 having an area that is small compared with—advantageously less than one-tenth than—that of the bottom surface of the chip.

The utilization circuitry 800 or 900, or both, can include test circuitry, and further utilization circuitry (not shown) can be connected to the one or more of the mother-board wiring layers 101, 102, 103, 104, as known in the art.

Instead of having the chip 300 electrically connected respectively to the circuit board 200 and to the I/O pads 301 and 302, by means of wire bonds 311 and 312, the chip 300 can be connected to the circuit board 100 by means of an array of solder bumps or other metallic array located between the bottom surface of the chip 300 and the top surface of the circuit board 200. As another alternative, the bottom surface of the chip 300, or the bottom surfaces of a plurality of such chips located side-by-side, can be electrically connected by means of such an array or by means of wire bonds to a top surface of a multichip assembly, the multichip assembly being located on the top surface of the circuit board 200, and the multichip assembly being electrically connected to the circuit board 200 by means of wire bonds. In any case, the circuit board 200 can still be electrically connected to the mother board 100 by means of exemplary solder bumps 201, 202, 203, and 204.

Moreover, a layer of a thermally conducting grease (not shown) can be placed on the bottom surface of the cover 600, in order to enhance heat-sinking through the cover 600 during electrical operations of the chip 300, especially in cases in which the cover 600 itself is a good thermal conductor. When using this layer of grease, advantageously the top surface of the gel medium does not rise to the level of coating the top surface of the chip 300, so that the layer of grease comes into physical contact with the top surface of the chip 300.

The cover 600 can be a composite comprising a premolded plastic having either its bottom surface, its top surface, or both its top surface and its bottom surface coated with a thermally or an electrically conducting layer, typically comprising metal. In this way the layer can provide either thermal conductance or electrical conductance for the cover, or both thermal and electrical conductance. This thermal conductance is advantageous for conducting heat away from the electronic device during electrical operations, and this electrical conductance is advantageous for protecting the electronic device against electromagnetic interference or electrostatic discharge (or both such interference and discharge).

What is claimed is:

1. An electronic package device comprising:
   (a) an electronic device having a bottom surface and at least a portion of a side surface coated with a pliant soft gel medium, the medium having a top surface and a side surface;
   (b) a rim member comprising premolded plastic material, surrounding the electronic device and having an internal side surface and a top surface, the side surface of the medium being bounded by the internal surface of said rim member, said top surface of said rim member including truncated pyramidal indentations; and
   (c) a cover member overlying both the rim member and the gel medium, said cover member having a bottom surface spaced apart from the top surface of said gel medium, and said cover member having truncated pyramidal projections and protruding ridge segments, said truncated pyramidal projections disposed between said protruding ridge segments, said truncated pyramidal projections located in registry with and engaging said pyramidal indentations, to hold said cover in position, said protruding ridge segments having outside surfaces spaced-apart from the internal side surface of the rim member for allowing thermal expansion mismatch between said cover member and said electronic device.

2. An electronic device package in accordance with claim 1 further comprising a circuit board supporting the electronic device.

3. The package of claim 1, or 2 further comprising utilization circuitry electrically connected to the electronic device.

4. The package of claim 1 in which said bottom surface of the cover member is spaced-apart everywhere from said top surface of the gel medium.

5. The package of claim 1 in which the cover member comprises a thermally conducting material.

6. The package of claim 1 in which the cover member comprises an electrically conducting material.

* * * * *